United States Patent [19]

Clark

[11] 4,180,432
[45] Dec. 25, 1979

[54] PROCESS FOR ETCHING SiO₂ LAYERS TO SILICON IN A MODERATE VACUUM GAS PLASMA

[75] Inventor: Harold A. Clark, Hopewell Junction, N.Y.

[73] Assignee: International Business Machines Corporation, Armonk, N.Y.

[21] Appl. No.: 861,796

[22] Filed: Dec. 19, 1977

[51] Int. Cl.² ............... B44C 1/22; C03C 15/00; C03C 25/06
[52] U.S. Cl. ..................... 156/643; 156/646; 156/657; 156/659.1; 204/192 E; 252/79.1
[58] Field of Search ............ 204/192 E, 192 EC, 164, 204/298; 156/643, 646, 657, 659, 661; 252/79.1

[56] References Cited

U.S. PATENT DOCUMENTS

| | | | |
|---|---|---|---|
| 3,615,956 | 10/1971 | Irving et al. | 156/643 X |
| 3,795,557 | 3/1974 | Jacob | 252/79.1 X |
| 3,880,684 | 4/1975 | Abe | 156/643 X |
| 4,025,411 | 5/1977 | Hom-Ma et al. | 204/192 E |
| 4,092,210 | 5/1978 | Hoepfner | 156/643 |
| 4,092,442 | 5/1978 | Agnihotri et al. | 156/643 X |

*Primary Examiner*—William A. Powell
*Attorney, Agent, or Firm*—David M. Bunnell

[57] ABSTRACT

Silicon dioxide is etched at about five times the rate of silicon in a moderate vacuum gas plasma formed from a mixture of $CF_4$ and oxygen wherein the mixture contains above about 5 to about 15 percent by volume $CF_4$ so that films of silicon dioxide on silicon can be etched to the silicon surface without excessive attack on the silicon. Silicon dioxide is etched at about three times the rate of silicon nitride so that silicon nitride can be used as an etch mask for the process.

4 Claims, No Drawings

PROCESS FOR ETCHING SiO₂ LAYERS TO SILICON IN A MODERATE VACUUM GAS PLASMA

BACKGROUND OF THE INVENTION

The etching of silicon and silicon compounds such as silicon dioxide and nitride in a gas plasma has been disclosed in connection with the manufacture of integrated circuits. Plasmas formed from fluorocarbons and fluorocarbon mixtures with oxygen are described, for example in U.S. Pat. Nos. 3,615,956 and 3,795,557. One disadvantage of such processes is that silicon is etched more rapidly than silicon dioxide. Therefore, in etching a layer of silicon dioxide on silicon, it is difficult to stop the process before an unacceptable amount of etching of the silicon surface takes place. Accordingly, the process becomes impractical and either a wet etch process must be used when etching the oxide or the plasma etch must be stopped short of the silicon surface and the etching of the oxide layer completed by wet etching.

Mixtures of hydrogen and fluorocarbons have been used to obtain a favorable etch rate ratio of silicon dioxide to silicon but the reaction is difficult to control and can result in polymer formation which stops the etching. A process has now been found which permits the etching of silicon dioxide layers to silicon using certain $CF_4$ and oxygen gas mixtures.

BRIEF SUMMARY OF THE INVENTION

In accordance with this invention a process for etching silicon dioxide is provided comprising exposing the silicon dioxide to a gas plasma formed from a mixture of $CF_4$ and oxygen wherein the mixture contains above about 5 to about 15 percent by volume of $CF_4$ and the remainder oxygen.

DETAILED DESCRIPTION

The process of the invention is carried out in a reaction chamber where inductively or capacitively coupled radio frequency energy is used to create a gas plasma at pressures in the range of about 0.5 to 2 torr. Suitable reactors are commercially available, for example, the LFE Model PDE 301 or PDE 501 systems.

Suitable gases for obtaining selective etching of silicon dioxide in the presence of silicon and/or silicon nitrides are mixtures of greater than about 5 to about 15 percent by volume of $CF_4$ and between about 85 to 95 percent by volume of oxygen. A mixture at a total pressure of about 1 torr containing only 5 percent by volume (0.05 torr partial pressure) of $CF_4$ in oxygen is not found to measurably etch silicon or silicon dioxide. A mixture at a total pressure of about 1 torr containing 15 percent by volume (0.15 torr partial pressure) of $CF_4$ was found to etch silicon oxide only about 1.6 times faster than silicon. At a partial pressure of 0.2 torr, silicon dioxide and silicon nitride etch at about the same rate. The $CF_4$ portion of the gas mixture, therefore, should be above about 5 percent by volume in order to etch $SiO_2$. It should not exceed about 15 percent by volume in order to maintain the favorable etch rate ratio of silicon dioxide to silicon. The preferred mixture to maximize the etch rate ratio between silicon dioxide and silicon and silicon nitride is about 10 percent by volume $CF_4$ and about 90 percent by volume $O_2$ which gives an etch rate ratio of oxide to silicon of about 5 to 1 and of oxide to nitride of about 3 to 1.

The relatively high percentages of oxygen in the gas mixtures causes them to attack untreated photoresist. Therefore, it is necessary to either use thick resist layers or auxiliary masking layers of materials which are not attacked by the plasma. Because the process of the invention provides an etch rate ratio of 3:1 for silicon dioxide to silicon nitride, silicon nitride can be used as the auxiliary masking layer. The process can be advantageously used in etching via holes through dielectric layers of silicon nitride and silicon dioxide to silicon. The resist pattern is formed on the nitride and the nitride is etched, for example, in a gas plasma of $CF_4$ or $CF_4$ containing about 8% by volume oxygen. The silicon dioxide is the etched to silicon using the process of the invention. The 5:1 etch rate of oxide to silicon permits the etching to be stopped at the silicon surface and at the same time the resist is removed so that a separate resist stripping step is not required.

The process of the invention is further illustrated by, but is not intended to be limited to, the following examples.

EXAMPLE 1

Silicon wafers having about a 1000 Å thick coating of thermal silicon dioxide on the surface and about a 1500 Å thick coating of silicon nitride on the silicon dioxide are coated with about a 1.0μ thick layer of a positive acting diazo-quinone sensitized phenol-formaldehyde novolak resin photoresist and the resist is patterned by standard photolithographic techniques to uncover portions of the silicon nitride layer for etching. The wafers are placed in a LFE Corp. PDE 301 plasma etch reactor and the nitride is etched using a mixture of 92% by volume $CF_4$ and 8 percent by volume $O_2$ at a pressure of 0.5 torr and a power of 300 watts. The gas plasma is then changed to a mixture of about 10 percent by volume $CF_4$ and about 90 percent by volume $O_2$ to a total pressure of about 1 torr at a power of 300 watts and the silicon dioxide is removed to silicon with the nitride acting as an etch mask. The resist is completely removed during the etch of the silicon dioxide layer to the silicon surface.

EXAMPLE 2

The etch rates in angstroms/min. of silicon, silicon dioxide and silicon nitride were measured in an LFE PDE 301 plasma etch reactor using the conditions set forth in Table I below at a power of 300 watts and a total pressure of about 1 torr.

TABLE I

| Partial Pressure in Torr | Partial Pressure of $O_2$ in Torr | Etch Rate Å/min. | | |
|---|---|---|---|---|
| | | $SiO_2$ | Si | $Si_3N_4$ |
| .05 $CF_4$ | .95 | 0 | 0 | — |
| .10 $CF_4$ | .90 | 100 | 20 | 30 |
| .15 $CF_4$ | .85 | 160 | 100 | — |
| .20 $CF_4$ | .80 | 160 | 100 | 140 |
| .30 $CF_4$ | .70 | — | 200 | — |
| .10 Freon 12 | .90 | 400 | 1600 | — |

From Table I, the partial pressure of $CF_4$ should be above 0.05 torr for etching to occur. At 0.15 torr or above the etch rate of silicon has increased relative to silicon dioxide so that the ratio of oxide to silicon is down to about 1.6 to 1. At about 0.1 torr of $CF_4$ the ratio is maximized at about 5 to 1.

EXAMPLE 3

U.S. Pat. No. 3,795,557 discloses, in the table spanning columns 5 and 6, the etching of thermal oxide at a power of 300 watts with a mixture of $CHF_3$ and 93.7% $O_2$ and a pressure of about 3 torr. No data is given on relative etch rates. In order to find out if this mixture produces the result obtained by the process of the invention, the etch rate ratios of silicon dioxide and silicon were measured in a LFE PDE 501 reactor at 400 watts with a mixture of $CHF_3$ and 93.7% by volume $O_2$ in different runs at total pressures of 0.5 and 3 torr. The results are given in Table II.

TABLE II

| Pressure Torr | Etch Rate Å/min. | | Ratio $SiO_2$/Si |
| --- | --- | --- | --- |
| | $SiO_2$ | Si | |
| 0.5 | 175 | 135–140 | 1.3:1 |
| 3.0 | 165 | 200 | .8:1 |

The results show that at the pressure conditions shown in the patent, silicon etched somewhat faster than silicon dioxide. At a lower pressure of 0.5 torr the oxide etched slightly faster but the ratio of only 1.3 to 1 would not permit an etch stop at the silicon surface.

The process of the invention reverses the usual etch rate ratios between silicon dioxide and silicon so that silicon dioxide layers can be etched at a reasonable rate to silicon and stopped at the silicon surface before significant etching of the silicon occurs. This eliminates the need to employ wet etching or gas mixtures containing hydrogen which can cause polymer formation which stops the etching of the oxide layer. The process permits the formation of via holes through silicon nitride and silicon dioxide dielectric layers with simultaneous stripping of the photoresist.

While the invention has been particularly shown and described with reference to preferred embodiments thereof, it will be understood by those skilled in the art that various changes and form and details may be made therein without departing from the spirit and scope of the invention.

What is claimed is:

1. A process for etching a layer of silicon dioxide in contact with silicon comprising forming a silicon nitride mask on the surface of the silicon dioxide, said mask having apertures through which the silicon dioxide layer is etched, and exposing the silicon dioxide to a gas plasma formed from a mixture of $CF_4$ and oxygen, wherein the mixture comprises above about 5 to about 15 percent by volume of $CF_4$ and the remainder oxygen, to etch the silicon dioxide down to the silicon surface.

2. The process of claim 1 wherein the total pressure of the mixture in the plasma is about 1 torr.

3. The process of claim 1 wherein the mixture comprises about 10 percent by volume $CF_4$ and about 90 percent by volume $O_2$ and the total pressure is about 1 torr.

4. A process for etching a layer of silicon dioxide in contact with silicon comprising forming a mask on the surface of the silicon dioxide, said mask being a composite layer of organic photoresist on silicon nitride and having apertures through which the silicon dioxide layer is etched, and exposing the silicon dioxide to a gas plasma formed from a mixture of $CF_4$ and oxygen, wherein the mixture comprises above about 5 to about 15 percent by volume of $CF_4$ and the remainder oxygen, to etch the silicon dioxide down to the silicon surface and to remove the photoresist during the etching of the silicon dioxide layer.

* * * * *